United States Patent
Kim et al.

(10) Patent No.: US 11,829,070 B2
(45) Date of Patent: Nov. 28, 2023

(54) APPARATUS FOR TREATING A SUBSTRATE

(71) Applicant: SEMES CO., LTD., Chungcheongnam-do (KR)

(72) Inventors: Ju Won Kim, Chungcheongnam-do (KR); Jun Ho Seo, Seoul (KR); Dong Woon Park, Seoul (KR); Sang Pil Yoon, Seoul (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 17/557,230

(22) Filed: Dec. 21, 2021

(65) Prior Publication Data
US 2022/0197145 A1    Jun. 23, 2022

(30) Foreign Application Priority Data
Dec. 21, 2020  (KR) .......................... 10-2020-0180312

(51) Int. Cl.
*G03F 7/16*   (2006.01)
*B05C 11/02*   (2006.01)

(52) U.S. Cl.
CPC .............. *G03F 7/162* (2013.01); *B05C 11/02* (2013.01)

(58) Field of Classification Search
USPC .......................... 118/52, 612, 319, 320, 326
See application file for complete search history.

(56) References Cited

U.S. PATENT DOCUMENTS

| | | | | |
|---|---|---|---|---|
| 2014/0137902 A1* | 5/2014 | Aiura | ................ | H01L 21/67051 134/104.2 |
| 2014/0182631 A1* | 7/2014 | Namba | ............. | H01L 21/67051 15/268 |
| 2015/0187613 A1* | 7/2015 | Wakiyama | .......... | H01L 21/6715 134/95.1 |
| 2022/0102169 A1* | 3/2022 | Kim | .................. | H01L 21/67178 |

FOREIGN PATENT DOCUMENTS

| | | |
|---|---|---|
| JP | 2004-207573 A | 7/2004 |
| JP | 6032189 A | 11/2016 |
| KR | 10-2012-0036491 A | 4/2012 |
| KR | 10-2019-0056904 A | 5/2019 |
| KR | 10-2019-0099124 A | 8/2019 |

OTHER PUBLICATIONS

Request for the Submission of an Opinion issued by the Korean Intellectual Property Office dated Nov. 21, 2022 in corresponding KR Patent Application No. 10-2020-00180312, with English Translation.

Request for the Submission of an Opinion issued by the Korean Intellectual Property Office dated Jul. 7, 2023 in corresponding KR Patent Application No. 10-2020-00180312, with English Translation.

\* cited by examiner

*Primary Examiner* — Yewebdar T Tadesse
(74) *Attorney, Agent, or Firm* — CARTER, DELUCA & FARRELL LLP

(57) ABSTRACT

An apparatus for treating a substrate, the apparatus comprising: a treating container having an inner space; a support unit supporting and rotating the substrate in the inner space; and an exhaust unit exhausting an air flow in the inner space, wherein the treating container includes an outer cup providing the inner space; and an inner cup disposed at the inner space and spaced apart from the outer cup, and wherein the outer cup has a protrusion at a side wall thereof.

10 Claims, 12 Drawing Sheets

APPARATUS FOR TREATING A SUBSTRATE

CROSS-REFERENCE TO RELATED APPLICATIONS

A claim for priority under 35 U.S.C. § 119 is made to Korean Patent Application No. 10-2020-0180312 filed on Dec. 21, 2020, in the Korean Intellectual Property Office, the entire contents of which are hereby incorporated by reference.

BACKGROUND

Embodiments of the inventive concept described herein relate to an apparatus for treating a substrate, and more particularly, relate to an apparatus for treating a substrate by supplying a liquid onto the rotating substrate.

Various processes such as a photolithography process, an etching process, an ashing process, a thin film deposition process, and a cleaning process are carried out to manufacture a semiconductor device or a flat plate display panel. Among these processes, the photolithography process includes supplying a photoresist to a semiconductor substrate to form a photoresist film on a surface of the substrate, exposing the photoresist film using a photomask, and then supplying a developing liquid to selectively remove portions of the photoresist film. These processes are performed in process chambers.

FIG. 1 is a schematic view illustrating a substrate treating apparatus 1 for applying photoresist to a substrate. Referring to FIG. 1, the substrate treating apparatus 1 includes a treating container 10 having an inner space, a support unit 20 for supporting the substrate W in the inner space, and a nozzle 30 for supplying a treating liquid 82 onto the substrate W placed on the support unit 20. The treating container 10 has an outer cup 12 and an inner cup 14. Furthermore, a fan filter unit (not shown) for supplying a downward air flow into the inner space is disposed over the treating container 10, and a drain tube 60 for draining the treating liquid and an exhaust tube 70 for exhausting an atmosphere in a processing space are connected to a bottom region of the inner space.

When the substrate treating apparatus 1 having the structure illustrated in FIG. 1 treats the substrate W while supplying the treating liquid 82 on the rotating substrate W, an air flow 84 on the surface of the substrate W flows from the center of the substrate W toward the edge thereof along the rotating direction of the substrate W by the centrifugal force. Thereafter, the airflow 84 flows into a space A1 between the outer cup 12 and the inner cup 14, collides with a bottom plate of the outer cup 12, flows into an exhaust tube 70 through a space A2 between the inner cup 14 and the exhaust tube 70, and is discharged to the outside as illustrated in FIG. 2. At this time, since a width of the space A1 between the outer cup 12 and the inner cup 14 is larger than a width of the space A2 between the inner cup 14 and the exhaust tube 70, a volume of an airflow flowing into the space A2 between the inner cup 14 and the exhaust tube 70 decreases, so a vortex is generated near the bottom plate of the outer cup 12. The air flow 84 is stagnant at the point where the vortex is generated, and the inner space is not smoothly evacuated accordingly.

Also, the vortex and the stagnant air flow hamper the air flow over the edge region of the substrate W when a film of the treating liquid 82 is formed on the substrate W. Due to this, the thickness of the thin film on the edge region of the substrate W is greater than the thickness of the thin film on the central region of the substrate W. Furthermore, due to the vortex, contaminants such as fumes flow back to the substrate W to contaminate the substrate W.

SUMMARY

Embodiments of the inventive concept provide a substrate treating apparatus for improving efficiency in treating a substrate.

Embodiments of the inventive concept provide a substrate treating apparatus for smoothly exhausting an air flow in a processing space when treating a substrate by supplying a treating liquid onto the rotating substrate in the treating space.

Embodiments of the inventive concept provide a substrate treating apparatus for forming a liquid film having a uniform thickness on the entire region of a substrate by supplying a treating liquid onto the rotating substrate.

Embodiments of the inventive concept provide a substrate treating apparatus for preventing re-adsorption of contaminants to a substrate when treating the substrate by supplying a treating liquid onto the rotating substrate.

The technical problems to be solved by the inventive concept are not limited to the aforementioned problems, and any other technical problems not mentioned herein will be clearly understood from the following description by those skilled in the art to which the inventive concept pertains.

An embodiment of the inventive concept provides a substrate treating apparatus.

The apparatus comprises: a treating container having an inner space; a support unit supporting and rotating the substrate in the inner space; and an exhaust unit exhausting an air flow in the inner space, wherein the treating container comprises: an outer cup providing the inner space; and an inner cup disposed at the inner space and spaced apart from the outer cup, the outer cup including a protrusion provided at a side wall.

In an embodiment, the outer cup comprises: a bottom wall; the side wall upwardly extending from an outer edge of the bottom wall; and a top wall inwardly extending from the side wall, and the inner cup comprises: an outer wall opposing the side wall of the outer cup; an inner wall opposing the outer wall; and a top wall connecting the outer wall and the inner wall, and the protrusion protrudes toward the outer wall of the inner cup.

In an embodiment, the protrusion is formed extending along a circumference of the side wall of the outer cup, and a distance between the protrusion and the bottom wall of the outer cup is uniform.

In an embodiment, the protrusion is formed extending along the circumference of the side wall of the outer cup, and a distance between the protrusion and the bottom wall of the outer cup is gradually decreasing in a direction from a top end of the outer cup to the bottom wall.

In an embodiment, the exhaust unit comprises: an exhaust tube disposed in an inside of the inner cup; and a pressure adjustment member forcefully exhausting an airflow within the inner space.

In an embodiment, a first passage is formed between the protrusion and the outer wall of the inner cup, a second passage is formed between the outer wall of the inner cup and the exhaust unit, and a width of the first passage and a width of the second passage is provided equally.

In an embodiment, a pressure sucking an air flow formed at the first passage is equal to a pressure sucking an air flow formed at the second passage and introduced into the first passage.

In an embodiment, the top wall of the outer cup comprises: an outer top wall upwardly extending and inclining from the side wall of the outer cup; and an inner top wall downwardly extending and inclining from the top wall of the outer cup, the inner top wall having a hole for introducing an air flow.

In an embodiment, the inner top wall of the outer cup comprises a top guide part disposed above the hole, and a bottom guide part disposed below the hole, the top guide part and the bottom guide part respectively comprising at least partially a curved surface, and the curved surface of the top guide part and the curved surface of the bottom guide part configuring an inside of the hole.

In an embodiment, the curved surface of the top guide part curves in an opposite direction of a curving direction of the curved surface of the bottom guide part.

In an embodiment, the curved surface of the top guide part and the curved surface of the bottom guide part are respectively provided in a streamlined shape.

In an embodiment, the apparatus further comprises a liquid supply unit supplying a treating liquid to the substrate supported by the support unit, the treating liquid being a photoresist liquid.

An embodiment of the inventive concept provides a substrate treating apparatus.

The apparatus comprises: a treating container having an inner space; a support unit supporting and rotating the substrate in the inner space; an exhaust unit exhausting an air flow in the inner space, wherein the treating container comprises: an outer cup providing the inner space; and an inner cup disposed at the inner space and spaced apart from the outer cup, the outer cup comprising: a bottom wall; a side wall upwardly extending from the bottom wall; an outer top wall upwardly inclining from the side wall; and an inner top wall downwardly inclining from the outer top wall, the inner top wall including a top guide part disposed above the hole formed at the inner top wall, and a bottom guide part disposed below the hole, the top guide part and the bottom guide part respectively configuring an inside of the hole and comprising at least partially a curved surface provided in a rounded shape.

In an embodiment, the curved surface of the top guide part and the curved surface of the bottom guide part are respectively provided in a streamlined shape.

In an embodiment, the curved surface of the top guide part curves in an opposite direction of a curving direction of the curved surface of the bottom guide part.

In an embodiment, a width of the hole of the inner top wall decreases as it follows a direction from a top surface to a bottom surface of the inner top wall.

In an embodiment, the outer cup comprises a protrusion disposed at a part of the side wall of the outer cup opposing the outer wall of the inner cup.

In an embodiment, the exhaust unit comprises: an exhaust tube disposed in an inside of the inner cup; and a pressure adjustment member forcefully exhausting an airflow within the inner space, and a first passage is formed between the protrusion and the outer wall of the inner cup, a second passage is formed between the outer wall of the inner cup and the exhaust unit, and the width of the first passage and the width of the second passage is provided equally.

In an embodiment, a pressure sucking an air flow formed at the first passage is equal to a pressure sucking an air flow formed at the second passage and introduced into the first passage.

An embodiment of the inventive concept provides a substrate treating apparatus.

The apparatus comprises: a treating container having an inner space; a support unit supporting and rotating the substrate in the inner space; and an exhaust unit exhausting an air flow in the inner space, wherein the treating container includes: an outer cup providing the inner space; an inner cup spaced apart from the outer cup and placed in the inner space; the outer cup comprising: a bottom wall; a side wall upwardly extending from the bottom wall; an outer top wall upwardly inclining from the side wall; and an inner top wall downwardly inclining from the outer top wall, the inner top wall including a top guide part disposed above the hole formed at the inner top wall, and a bottom guide part disposed below the hole, the top guide part and the bottom guide part respectively configuring an inside of the hole and comprising at least partially a curved surface provided in a rounded shape, the outer cup comprising a protrusion disposed at a part of the side wall of the outer cup opposing an outer wall of the inner cup, and a width of the first passage formed between the protrusion and the outer wall of the inner cup and a width of the second passage formed between the outer wall of the inner cup and an exhaust tube provided equally.

According to the inventive concept, a substrate treating apparatus capable of improving substrate treating efficiency may be provided.

In addition, when a substrate is treated by supplying a treating liquid to a rotating substrate in a treating space, a vortex and a backflow may be prevented and an exhaust flow rate may be increased to smoothly exhaust an airflow in the treating space.

In addition, when a treating liquid is supplied to the rotating substrate to form a liquid film on the substrate, the thickness of the liquid film may be uniformly provided on the entire area of the substrate.

In addition, it is possible to prevent contaminants from being re-adsorbed to the substrate when treating the substrate by supplying a treating liquid to the rotating substrate.

The effects of the inventive concept are not limited to the above-described effects, and effects not mentioned will be clearly understood by those skilled in the art from the present specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
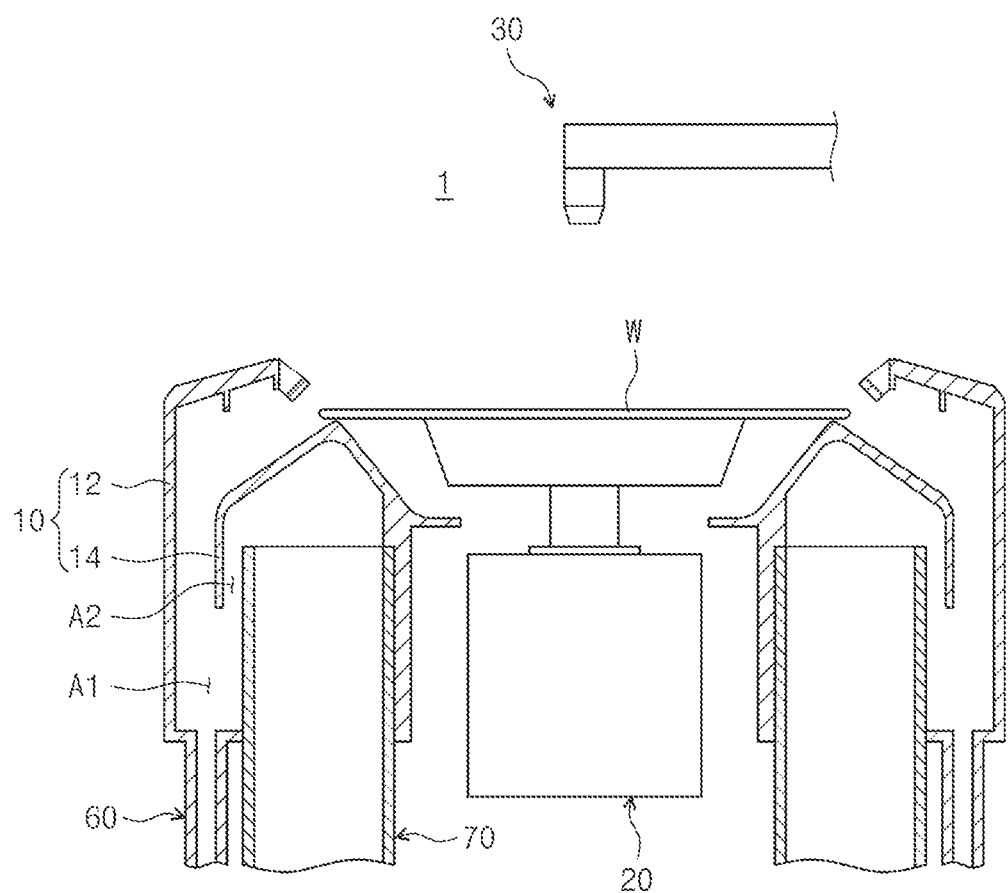
FIG. 1 is a sectional view illustrating a substrate treating apparatus having a general structure for performing a liquid treatment on a substrate while rotating the substrate.
Figure 2:
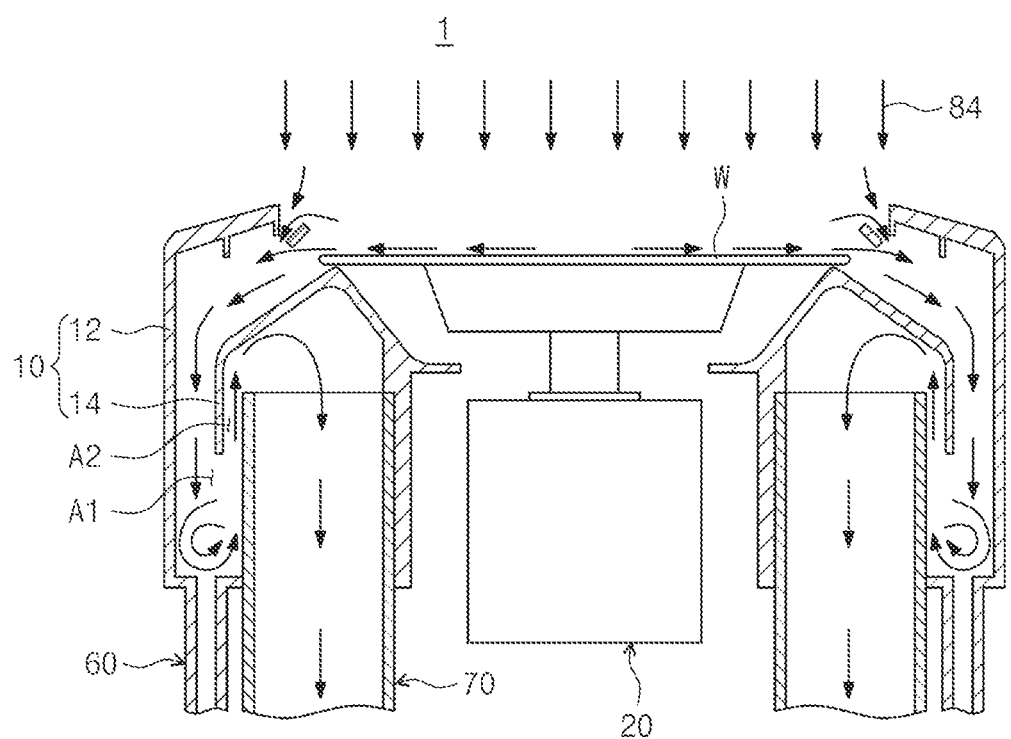
FIG. 2 is a sectional view illustrating a flow of an air flow at the substrate treating apparatus of FIG. 1.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear. In addition, the same reference numerals are used throughout the drawings for parts that perform similar functions and functions.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "includes", "including", and/or "comprising," when used in this specification, specify the presence of stated features, integers, steps, operations, elements, and/or components, but do not preclude the presence or addition of one or more other features, integers, steps, operations, elements, components, and/or groups thereof.

Singular expressions include plural expressions unless they explicitly have a different meaning in the context. In addition, the shape and size of the elements in the drawings may be exaggerated for clearer explanation.

As used herein, the term "and/or" includes any and all combinations of one or more of the associated listed items. Also, the term "exemplary" is intended to refer to an example or illustration. In addition, the term "connected" or "connecting" herein refers not only to a case where member A and member B are directly connected to each other, but also to a case where member C is interposed between member A and member B to be indirectly connected to each other.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

An embodiment of the inventive concept may be modified into various forms, and the scope of the inventive concept should not be construed as being limited to the following embodiments. The embodiment is provided to more fully explain the inventive concept to those with an average knowledge in the art. Therefore, the shape of the elements in the drawings is exaggerated to emphasize a clearer explanation. The device of the embodiment may be used to perform a photolithography process on a circular substrate. In particular, the device of the embodiment may be connected to an exposing device and used to perform an applying process and a developing process on a substrate. However, the technical idea of the inventive concept is not limited thereto, and may be used in various kinds of processes for supplying a treating liquid to the substrate while rotating the substrate. Hereinafter, a case in which a wafer is used as a substrate will be described as an example.

Hereinafter, an embodiment of the inventive concept will be illustrated with reference to FIG. 3 to FIG. 12.

Figure 3:
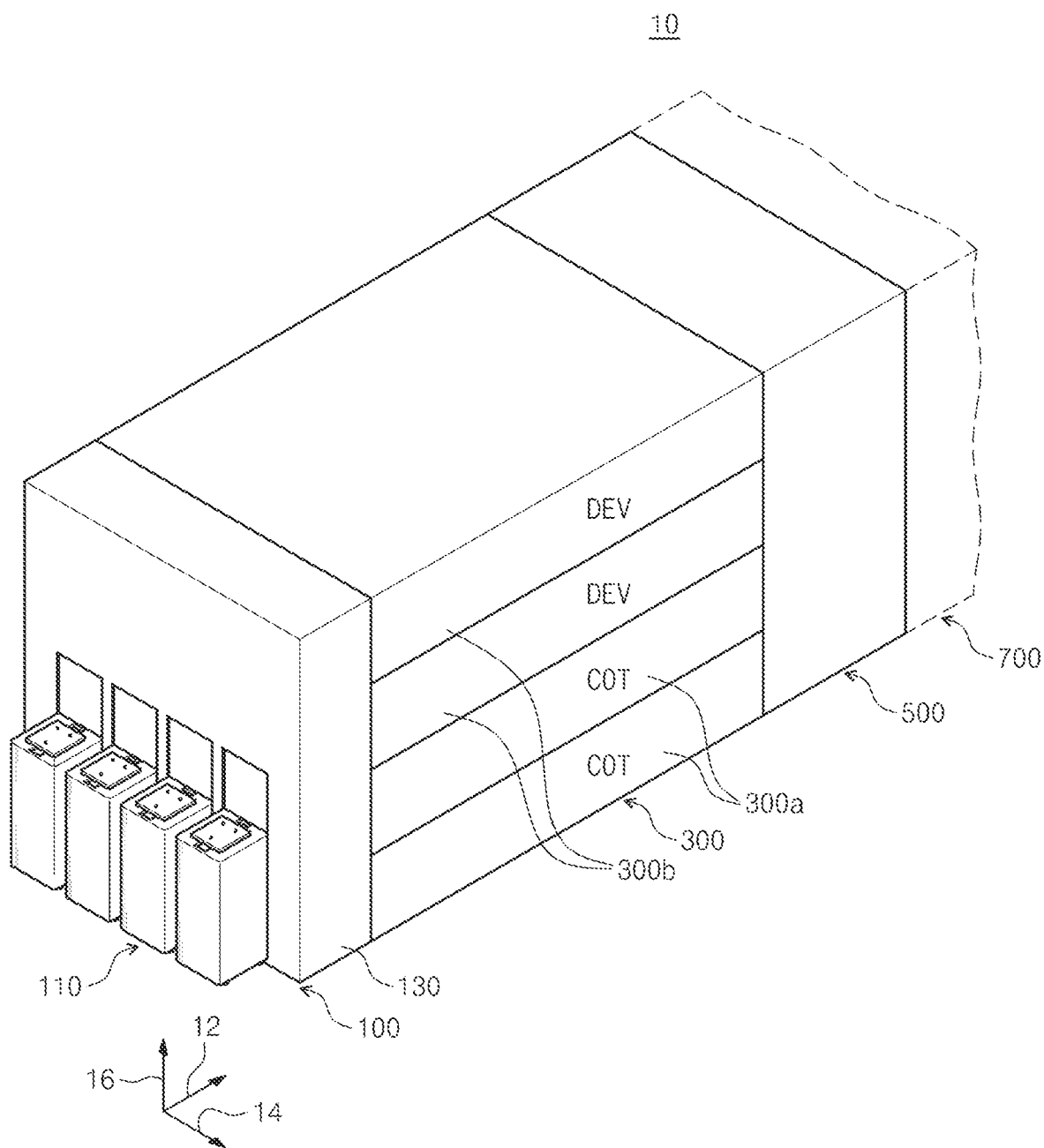
FIG. 3 is a perspective view schematically illustrating the substrate treating apparatus of the inventive concept.
Figure 4:
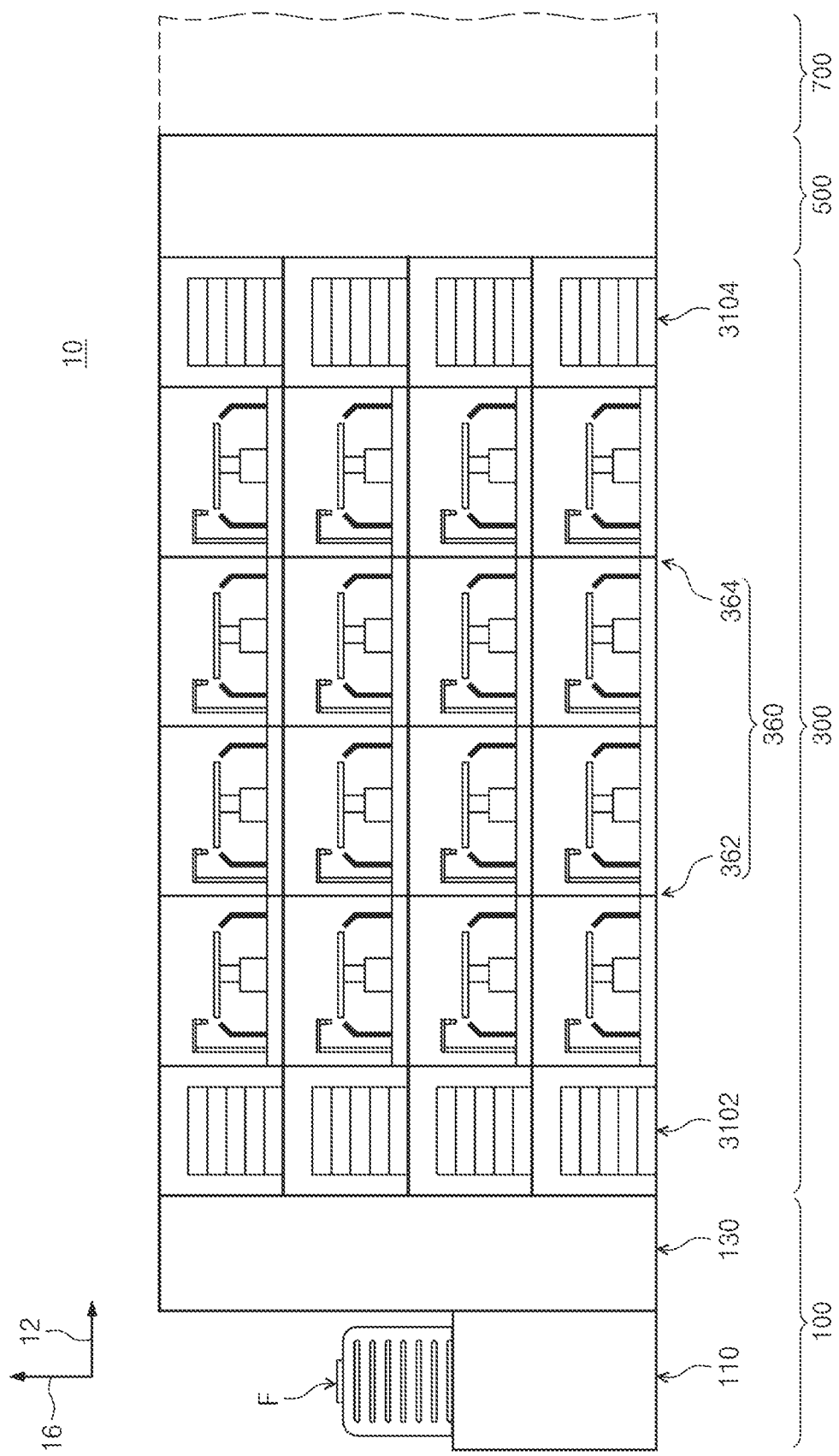
FIG. 4 is a sectional view of the substrate treating apparatus illustrating coating blocks and/or developing blocks of FIG. 3.
Figure 5:
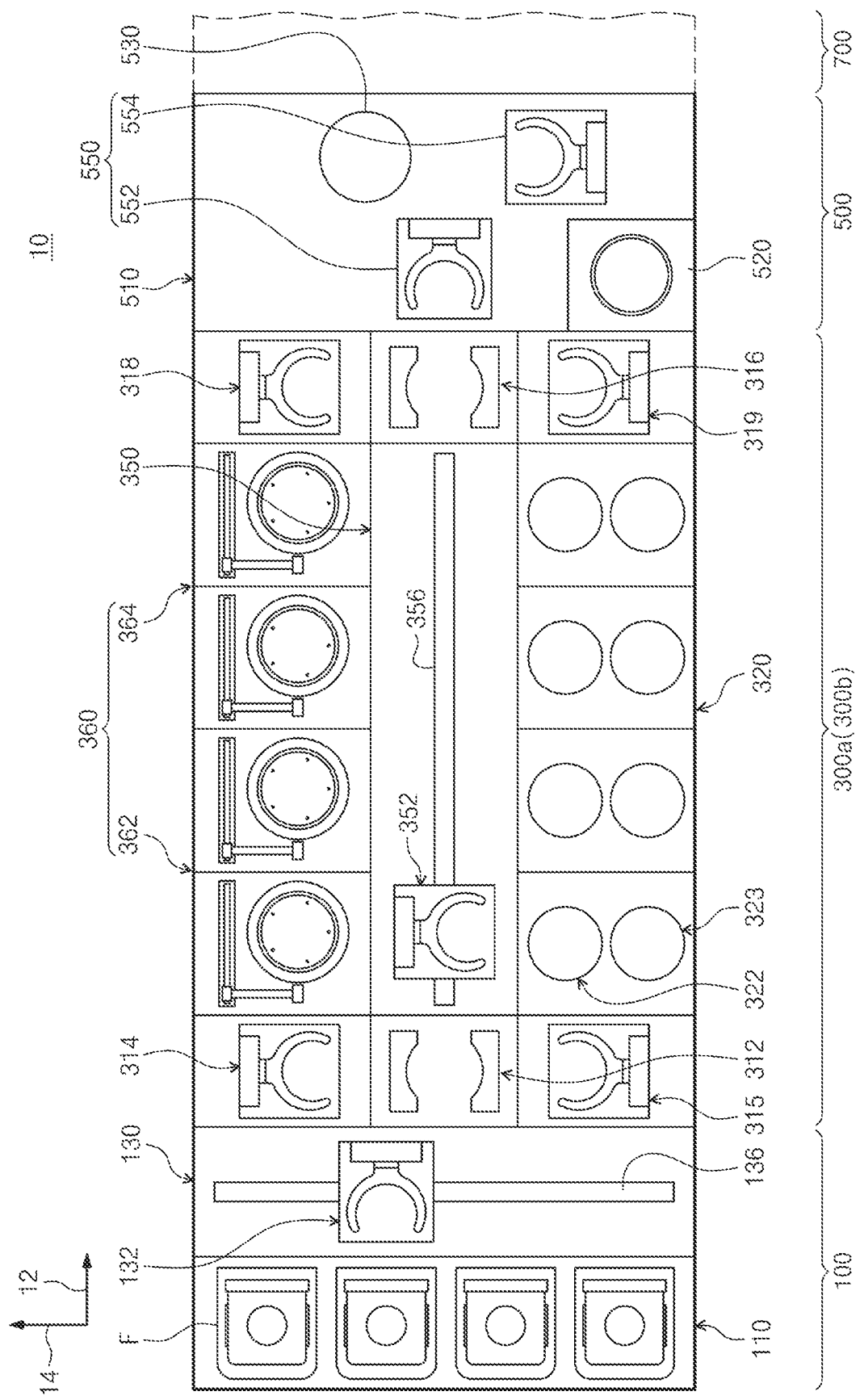
FIG. 5 is a plan view of the substrate treating apparatus of FIG. 3.
Figure 6:
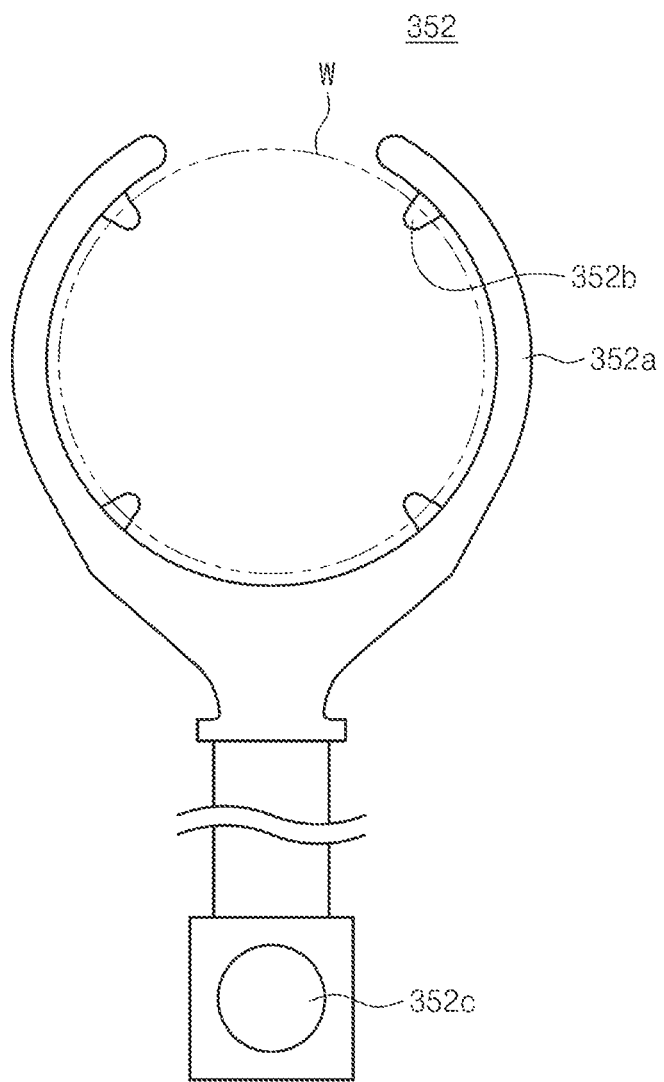
FIG. 6 is a plan view schematically illustrating a transfer robot of FIG. 5.

FIG. 3 illustrates a substrate treating apparatus according to an embodiment of the inventive concept, FIG. 4 illustrates a coating block or a developing block of FIG. 3, and FIG. 5 shows the substrate treating apparatus of FIG. 3.

Referring to FIG. 3 to FIG. 5, the substrate treating apparatus 10 according to an embodiment of the inventive concept comprises an index module 100, a processing module 300, and an interface module 500. According to an embodiment, the index module 100, the processing module 300, and the interface module 500 are sequentially arranged in a row. Hereinafter, a direction in which the index module 100, the processing module 300, and the interface module 500 are arranged will be referred to as a first direction 12, a direction that is perpendicular to the first direction 12 when viewed from above will be referred to as a second direction 14, and a direction that is perpendicular to both the first direction 12 and the second direction 14 will be referred to as a third direction 16.

The index module 100 transfers the substrate W from the container F in which the substrate W is stored to the processing module 300, and gets the processed substrate W from the processing module 300 to be stored in the container F. The index module 100 is provided with its length extending along the second direction 14. The index module 100 has a load port 110 and an index frame 130. The index frame 130 is placed between the load port 110 and the processing module 300. The container F in which the substrates W are stored is placed at the load port 110. A plurality of load ports 110 may be provided, and the plurality of load ports 110 may be placed along the second direction 14.

For the container F, a closing-type container F such as a front open unified pod (FOUP) can be used. The container F can be placed on the load port 110 by a transfer means (not shown) such as an overhead transfer, an overhead conveyor, or an automatic guided vehicle, or the container F may be placed on the load port 110 by an operator.

An index robot 132 is provided inside the index frame 130. In the index frame 130, a guide rail 136 is provided with its length extending along the second direction 14, and the index robot 132 may be provided movable on the guide rail 136. The index robot 132 includes a hand on which the substrate W is placed, and the hand may be provided to be forwardly and backwardly movable, rotatable with the third direction 16 as an axis, and movable along the third direction 16.

The processing module 300 may perform a coating process and a developing process on the substrate W. The processing module 300 may receive the substrate W stored in the container F and perform a substrate treating process. The processing module 300 has a coating block 300a and a developing block 300b. The coating block 300a performs a coating process on the substrate W, and the developing block 300b performs a developing process on the substrate W. A plurality of the coating blocks 300a are provided, and the plurality of coating blocks 300a are provided to be stacked one above another. A plurality of the developing blocks 300b are provided, and the plurality of developing blocks 300b are provided to be stacked one above another. According to an embodiment of FIG. 3, two coating blocks 300a are provided, and two developing blocks 300b are provided. The coating blocks 300a may be disposed under the developing blocks 300b. In an embodiment, the two coating blocks 300a perform the same process and may be provided in the same structure. In addition, the two developing blocks 300b perform the same process and may be provided in the same structure.

Referring to FIG. 5, the coating block 300a includes a heat treatment chamber 320, a transfer chamber 350, a liquid treatment chamber 360, and buffer chambers 312 and 316. The heat treatment chamber 320 may be chambers for performing a heat treatment process on the substrate W. The heat treatment process may include a cooling process and a heating process. The liquid treatment chamber 360 supplies liquid onto the substrate W to form a liquid layer. The liquid layer may be a photoresist film or an anti-reflection film. The transfer chamber 350 transfers the substrate W between the heat treatment chamber 320 and the liquid treatment chamber 360 in the coating block 300a.

The transfer chamber 350 is provided is provided such that its lengthwise direction is parallel to the first direction 12. A transfer robot 352 is provided in the transfer chamber 350. The transfer robot 352 transfers the substrate among the heat treatment chamber 320, the liquid treatment chamber 360, and the buffer chambers 312 and 316. In an embodiment, the transfer robot 352 has a hand on which the substrate W is placed, and the hand may be provided to be forwardly and backwardly movable, rotatable with the third direction 16 as an axis, and movable along the third direction 16. A guide rail 356 is provided in the transfer chamber 350 such that its lengthwise direction is parallel to the first direction, and the transfer robot 352 may be provided to be movable on the guide rail 356.

Figure 7:
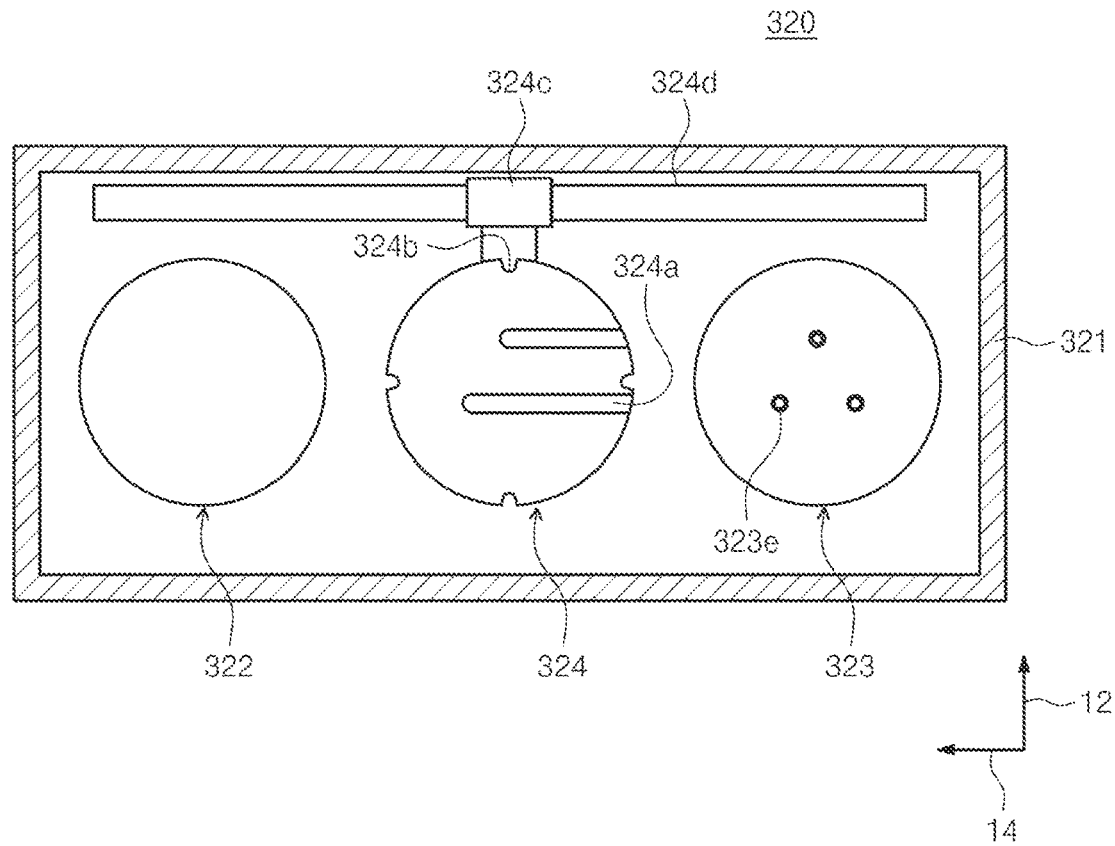
FIG. 7 is a schematic plan view illustrating an embodiment of heat treatment chambers of FIG. 5.

FIG. 7 illustrates an example of a hand of a transfer robot. Referring to FIG. 7, the hand 352 has a base 352a and a support protrusion 352b. The base 352a may have an annular ring shape in which a part of the circumference is bent. The base 352a has an inner diameter larger than the diameter of the substrate W. The support protrusion 352b extends inward from the base 352a. A plurality of support protrusions 352b are provided and support an edge region of the substrate W. According to an embodiment, four support protrusions 352b may be provided at equal intervals.

A plurality of heat treatment chambers 320 are provided. The heat treatment chambers 320 are arranged along the first direction 12. The heat treatment chambers 320 are placed on one side of the transfer chamber 350.

Figure 8:
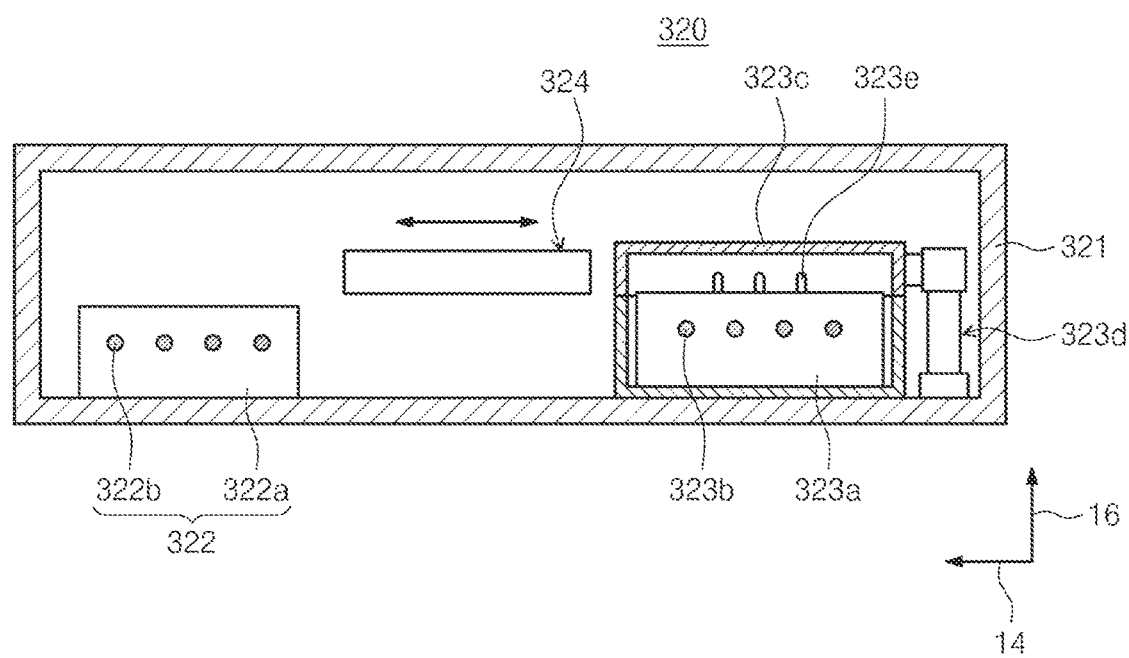
FIG. 8 is a front view of a heat treatment chamber of FIG. 5.

FIG. 7 shows the heat treatment chamber of FIG. 5, and FIG. 8 shows the heat treatment chamber of FIG. 7 according to an embodiment of the inventive concept.

Referring to FIG. 7 and FIG. 8, the heat treatment chamber 320 includes a housing 321, a cooling unit 322, a heating unit 323, and a transfer plate 324.

The housing 321 is provided in a substantially rectangular parallelepiped shape. An inlet (not shown) through which the substrate W enters and exits is provided on the sidewall of the housing 321. The inlet may remain open. Selectively, a door (not shown) may be provided to open and close the inlet. The cooling unit 322, the heating unit 323, and the transfer plate 324 are provided in the housing 321. The cooling unit 322 and the heating unit 323 are provided side by side along the second direction 14. In an embodiment, the cooling unit 320 may be placed closer to the transfer chamber 350 than the heating unit 323.

The cooling unit 322 has a cooling plate 322a. The cooling plate 322a may have a substantially circular shape when viewed from above. The cooling plate 322a is provided with a cooling member 322b. In an embodiment, the cooling member 322b is formed inside the cooling plate 322a and may be provided as a passage through which the cooling fluid flows.

The heating unit 323 has a heating plate 323a, a cover 323c, and a heater 323b. The heating plate 323a has a generally circular shape when viewed from above. The heating plate 323a has a larger diameter than the substrate W. The heating plate 323a is equipped with a heater 323b. The heater 323b may be implemented with a resistance heating element to which an electric current is applied. The heating plate 323a is provided with lift pins 323e that may be vertically movable along the third direction 16. The lift pins 323e receive the substrate W from the transfer means outside the heating unit 323 and place the substrate W down on the heating plate 323a or raise the substrate W off the heating plate 323a and transfer the substrate W to the transfer means outside the heating unit 323. In an embodiment, three lift pins 323e may be provided. The cover 323c has a space therein, which is open at the bottom. The cover 323c is located over the heating plate 323a and is moved in an up/down direction by the driver 323d. A space formed together with the heating plate 323a by moving the cover 323c serves as a heating space in which the substrate W is heated.

The transfer plate 324 has a substantially circular shape and has a diameter corresponding to that of the substrate W. A notch 324b is formed at an edge of the transfer plate 324. The notch 324b may have a shape corresponding to the protrusion 352b formed on the hand 354 of the transfer robot 352. In addition, as many notches 324b as the protrusion 352b formed on the hand 354 are formed in a position corresponding to the protrusions 352b. When the vertically aligned positions of the hand 354 and the transfer plate 324 are changed in the vertical direction, the substrate W is transferred between the hand 354 and the transfer plate 324. The transfer plate 324 may be mounted on the guide rail 324d and is movable along the guide rail 324d by the driver 324c. A plurality of guide grooves 324a in a slit shape are provided in the transfer plate 324. The guide grooves 324a inwardly extends from the edge of the transfer plate 324 into the inside of the transfer plate 324. The guide grooves 324a are provided with their length extending along the second direction 14, and the guide grooves 3242 are located to be spaced apart from each other along the second direction 14. The guide grooves 324a prevent the transfer plate 324 and the lift pin 323e from interfering with each other when the substrate W is handed over between the transfer plate 324 and the heating unit 323.

The substrate W is cooled in a state in which the transfer plate 324 having the substrate W placed thereon is brought into contact with the cooling plate 322a. For efficient heat transfer between the cooling plate 322a and the substrate W, the transfer plate 324 is formed of a material having high heat conductivity. In an embodiment, the transfer plate 324 may be formed of a metallic material.

The heating unit 323 provided in some of the heat treatment chambers 320 may supply gas while heating the substrate W to improve the adhesion of the photoresist to the substrate W. In an embodiment, the gas may be hexamethyldisilane (HMDS) gas.

A plurality of liquid treatment chambers 360 are provided. Some of the liquid treatment chambers 360 may be stacked one above another. The liquid treatment chambers 360 are located on one side of the transfer chamber 350. The liquid treatment chambers 360 are arranged side by side along the first direction 12. Some of the liquid treatment chambers 360 are located adjacent to the index module 100. Hereinafter, these liquid treatment chambers 360 are referred to as front liquid treatment chambers 362. Some other liquid treatment chambers 360 are located adjacent to the interface module 500. Hereinafter, these liquid treatment chambers 360 are referred to as rear liquid treatment chambers 364.

Each of the front liquid treatment chambers 362 applies a first liquid onto the substrate W, and each of the rear liquid treatment chambers 364 applies a second liquid onto the substrate W. The first liquid and the second liquid may be different types of liquid. In an embodiment, the first liquid may be a liquid for forming an anti-reflection layer, and the second liquid may be a liquid for forming a photoresist layer. The photoresist liquid may be applied onto the substrate W coated with the anti-reflection film. Selectively, the first liquid may be a photoresist liquid, and the second liquid may be a liquid for forming an anti-reflection layer. In this case, the liquid for forming the anti-reflection layer may be applied onto the substrate W coated with photoresist layer. Selectively, the first liquid and the second liquid may be the same kind of liquid, and both the first liquid and the second liquid may be liquids for forming photoresist layer.

The developing block 300b has a same structure with the coating block 300a, and the liquid treatment chamber provided to the developing block 300b supplies a developing solution to the substrate W.

The interface module 500 connects the processing module 300 with an external exposure apparatus 700. The interface module 500 has an interface frame 510, an additional process chamber 520, an interface buffer 530, and an interface robot 550.

A fan filter unit that forms a downward air flow may be provided at a top end of the interface frame 510. The additional process chamber 520, the interface buffer 530, and the interface robot 550 are disposed within the interface frame 510. The additional process chamber 520 may perform a predetermined additional process before the substrate W treated in the coating block 300a is transferred to the exposure apparatus 700. Selectively, the additional process chamber 520 may perform a predetermined additional process before the substrate W treated in the exposure apparatus 700 is transferred to the developing block 300b. In an embodiment, the additional process may be an edge exposing process of exposing the edge region of the substrate W, a top side cleaning process of cleaning the top side of the substrate W, or a backside cleaning process of cleaning the backside of the substrate W. A plurality of additional process chambers 520 may be provided, and the additional process chambers 520 may be stacked one above another. All of the additional process chambers 520 may be provided to perform the same process. Selectively, some of the additional process chambers 520 may be provided to perform different processes.

The interface buffer 530 provides a space in which the substrate W transferred between the coating block 300a, the additional process chamber 520, the exposure apparatus 700, and the developing block 300b temporarily stays while being transferred. A plurality of interface buffers 530 may be provided, and the plurality of interface buffers 530 may be stacked one above another.

In an embodiment, the additional process chambers 520 may be disposed on one side of an extension line opposing the lengthwise direction of the transfer chamber 350, and the interface buffer 530 may be disposed on an opposite side of the extension line.

The interface robot 550 transfers the substrate W between the coating block 300a, the additional process chamber 520, the exposure apparatus 700, and the developing block 300b. The interface robot 550 may have a transfer hand for transferring the substrate W. One or a plurality of the interface robot 550 may be provided. In an embodiment, the interface robot 550 has a first robot 552 and a second robot 554. The first robot 552 may be provided to transfer the substrate W between the coating block 300a, the additional process chamber 520, and the interface buffer 530, and the second robot 554 may transfer the substrate W between the interface buffer 530 and the exposure apparatus 700, and the second robot 554 may transfer the substrate W between the interface buffer 530 and the developing block 300b.

Each of the first robot 552 and the second robot 554 includes a transfer hand on which the substrate W is placed, and the hand may be provided to be movable forwardly and backwardly, rotatable with respect to an axis parallel to the third direction 16, and movable along the third direction 16.

Hereinafter, a structure of a substrate treating apparatus for treating the substrate by supplying the treating liquid onto the rotating substrate among substrate treating apparatuses of the inventive concept will be described in detail. It will be exemplified that the substrate treating apparatus is an apparatus for applying photoresist. However, the substrate treating apparatus may be an apparatus for forming a film, such as a protective film or an anti-reflection film, on a rotating substrate W. Selectively, the substrate treating apparatus may be an apparatus for supplying a treating liquid 82, such as a developing solution, onto a substrate W.

Figure 9:
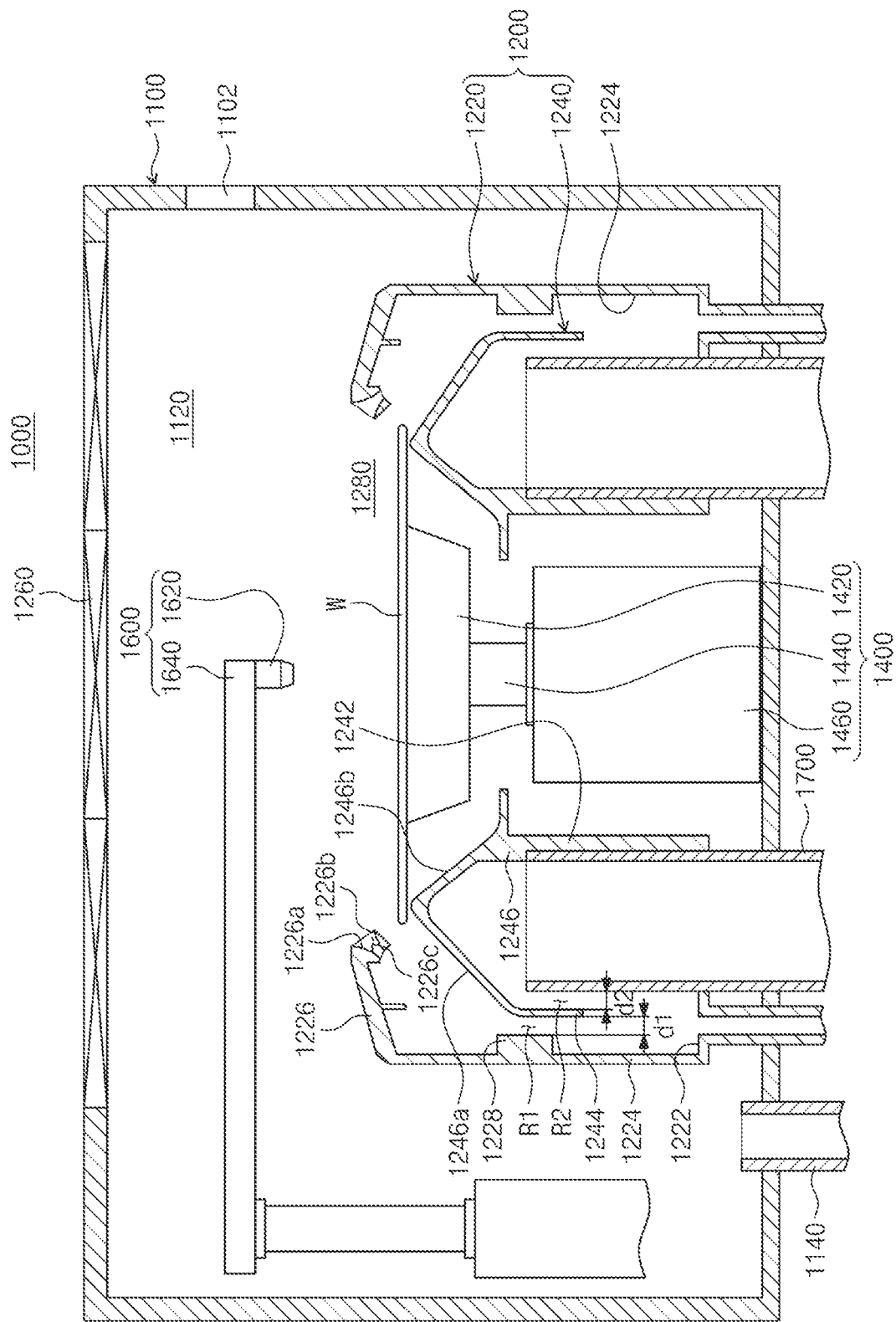
FIG. 9 is a schematic sectional view illustrating a structure of the substrate treating apparatus for treating the substrate by supplying a liquid onto a rotating substrate according to an embodiment of the inventive concept.
Figure 10:
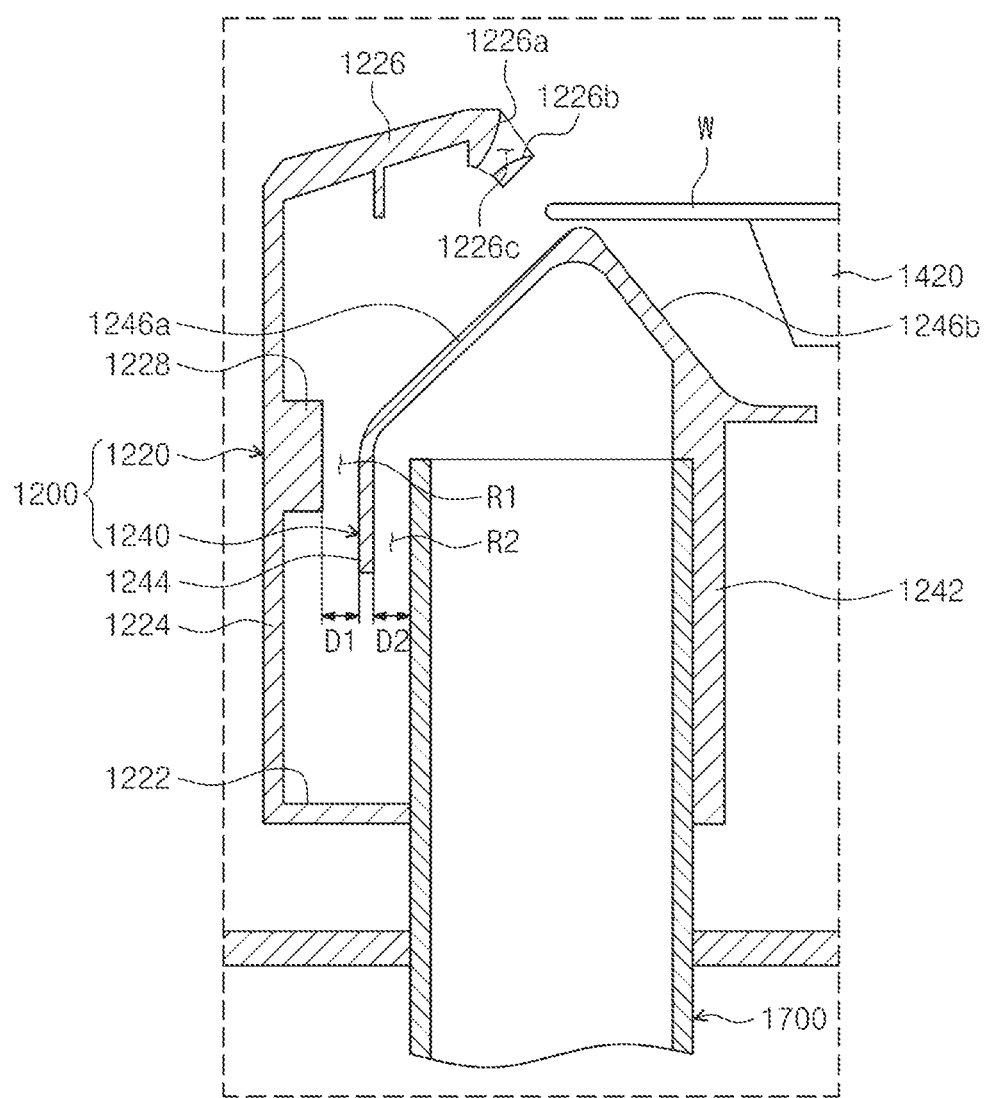
FIG. 10 is an enlarged drawing of a part of the substrate treating apparatus of FIG. 9.
Figure 11:
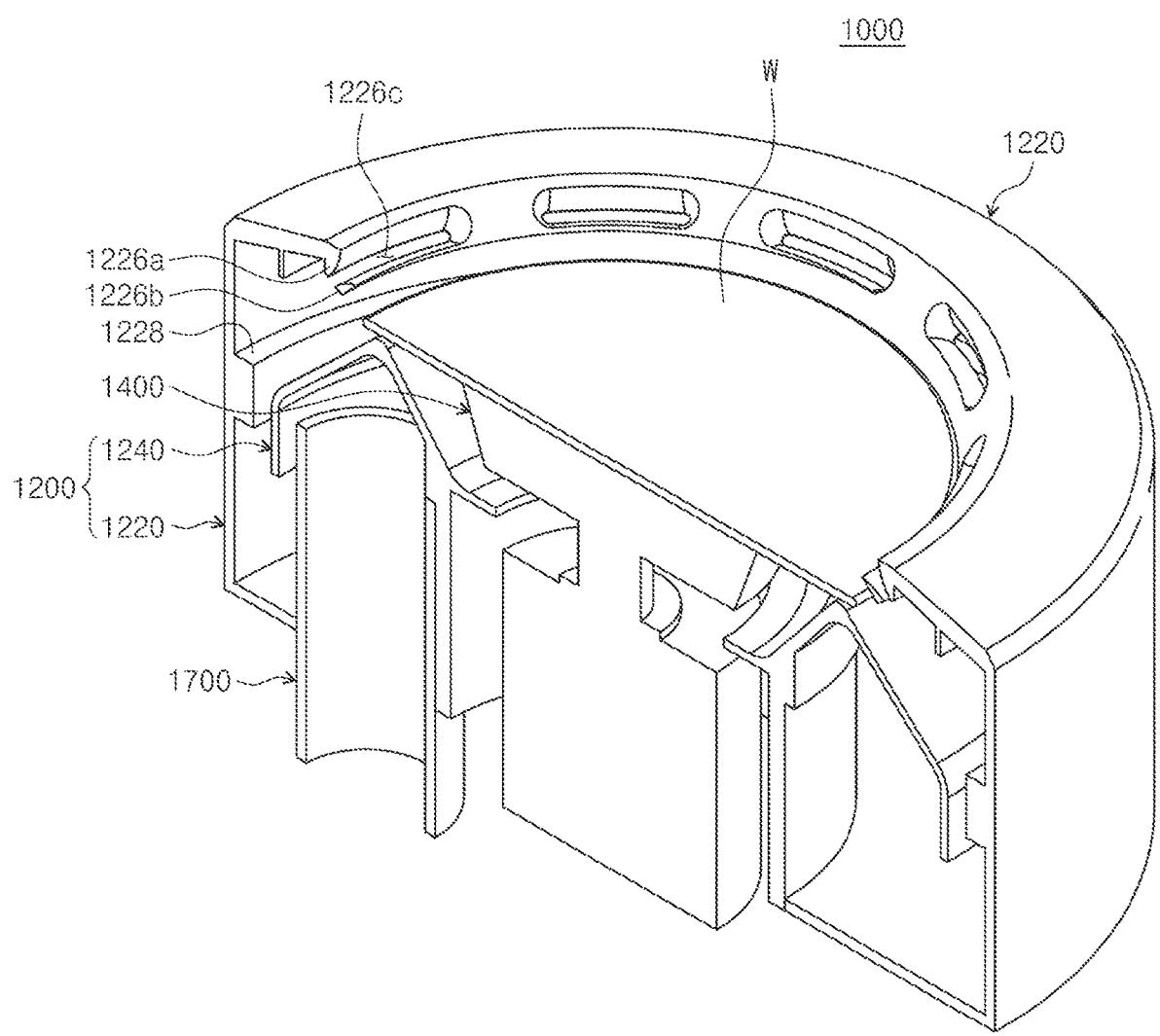
FIG. 11 is a perspective view of the substrate treating apparatus of FIG. 9.

FIG. 9 illustrates an embodiment of the inventive concept of a structure of the substrate treating apparatus for treating the substrate by supplying the treating liquid onto the rotating substrate, FIG. 10 is an enlarged view illustrating a part of the substrate treating apparatus of FIG. 9, and FIG. 11 is a perspective view illustrating the substrate treating apparatus of FIG. 9.

Referring to FIG. 9 to FIG. 11, the substrate treating apparatus 1000 includes a housing 1100, a treating container 1200, a support unit 1400, a liquid supply unit 1600, and an exhaust unit 1700.

The housing 1100 may be provided in a rectangular container shape having an inner space 1120. An opening 1102 may be formed in a sidewall of the housing 1100. The opening 1102 may function as an entrance/exit passage through which the substrate W enters and exits the housing 1100. A door (not shown) may be provided on the sidewall of the housing 1100 and opens and closes the opening 1102.

The treating container 1200 may be disposed in the inner space 1120 of the housing 1100. The treating container 1200 has an inner space 1280. The inner space 1280 is open at the top.

The support unit 1400 supports the substrate W in the inner space 1280 of the treating container 1200. The support unit 1400 has a support plate 1420, a rotary shaft 1440, and a driver 1460. The support plate 1420 has a circular top surface. The support plate 1420 has a smaller diameter than the substrate W. The support plate 1420 supports the substrate W by vacuum pressure. Selectively, the support plate 1420 may have a mechanical clamping structure that supports the substrate W. The rotary shaft 1440 is coupled to the center of the bottom surface of the support plate 1420, and the driver 1460 providing torque to the rotary shaft 1440 is coupled to the rotary shaft 1440. The driver 1460 may be a motor.

The liquid supply unit 1600 supplies the treating liquid 82 onto the substrate W. The treating liquid 82 may be a coating solution such as photoresist. The liquid supply unit 1600 has a nozzle 1620, a nozzle moving member 1640, and a liquid supply source (not shown). The nozzle 1620 may include one or a plurality of nozzles. The nozzle 1620 supplies the treating liquid 82 onto the substrate W. The nozzle 1620 is supported on the nozzle moving member 1640. The nozzle moving member 1640 moves the nozzle 1620 between a process position and a standby position. In the process position, the nozzle 1620 supplies the treating liquid 82 onto the substrate W placed on the support plate 1420. After completely supplying the treating liquid 82, the nozzle 1620 stands by in the standby position. In the standby position, the nozzle 1620 stands by in a home port (not shown). The home port is located outside of the treating container 1200 in the housing 1100.

A fan filter unit 1260 is disposed inside a top wall of the housing 1100 and supplies a downward air flow 84 into the inner space 1120. The fan filter unit 1260 has a fan that introduces outside air into the inner space 1120 and a filter that filters the outside air.

An exhaust tube 1140 is connected to the housing 1100 so as to be located outward of the treating container 1200 and exhausts, to the outside, the air flow 84 supplied into the space between the treating container 1200 and the housing 1100.

The treating container 1200 may include an outer cup 1220 and an inner cup 1240.

The outer cup 1220 may be provided to surround the support unit 1400 and the substrate W supported on the support unit 1400. The outer cup 1220 has a bottom wall 1222, a sidewall 1224, and a top wall 1226. The inside of the outer cup 1220 is provided as the inner space 1280 described above.

The bottom wall 1222 has a circular shape and has an opening in the center thereof. The sidewall 1224 upwardly extends from the outside end of the bottom wall 1222. The sidewall 1224 has a ring shape and is perpendicular to the bottom wall 1222. According to an embodiment, the sidewall 1224 extends to a height equal to or slightly lower than the height of the top surface of the support plate 1420. The top wall 1226 has a ring shape and has an opening in the center thereof. The top wall 1226 comprises an outer top wall extending and inclining upwardly from the top end of the side wall 1224 toward a central axis of the outer cup 1220, and an inner top wall extending and inclining downwardly from the outer top wall toward the substrate.

The outer cup 1220 includes a protrusion 1228 inwardly protruding from an inner surface of the sidewall 1224. The protrusion 1228 is formed to inwardly protrude from at least a part of the inner surface of the sidewall 1224. The protrusion 1228 is formed to extend along the inner surface of the sidewall 1224 of the outer cup 1220. The protrusion 1228 may be disposed to face the outer wall 1244 of the inner cup 1240. The protrusion 1228 may be located in a space between the sidewall 1224 of the outer cup 1220 and the outer wall 1244 of the inner cup 1240. The protrusion 1228 is spaced apart from the outer wall 1244 of the inner cup 1240. The space between the protrusion 1228 and the outer wall 1244 of the inner cup 1240 forms a first passage R1 through which the airflow 84 moves. The protrusion 1228 may prevent the airflow 84 introduced between the sidewall 1224 of the outer cup 1220 and the outer wall 1244 of the inner cup 1240, or the airflow 84 introduced between the protrusion 1228 of the outer cup 1220 and the outer wall 1244 of the inner cup 1240 from flowing back.

The outer cup 1220 includes a hole 1226c formed in the top wall 1226. When the substrate W is rotated, a downward airflow 84 provided to an upper region of the substrate W flows in a direction from the center region of the substrate W toward the edge region of the substrate W by a centrifugal force. In the surface of the substrate W and the region adjacent thereto, the airflow 84 flows toward an outside of the substrate W while bending in a same direction as the rotation direction of the substrate W. When the airflow 84 deviates from the top surface of the substrate W, the airflow 84 passes through the hole 1226c and flows into a space between the outer cup 1220 and the inner cup 1240, or flows into the space between the outer cup 1220 and the inner cup 1240 without passing through the hole 1226c.

The hole 1226c is formed on the inner top wall. The hole 1226c includes a top guide part 1226a disposed above the hole 1226c, and a bottom guide part 1226b disposed below the hole 1226c among the inner top walls. The top guide part 1226a includes at least a portion of a curved surface. The bottom guide part 1226b includes at least a portion of the curved surface. The curved surface of the top guide part 1226a and the curved surface of the bottom guide part 1226b may constitute the inner surface of the hole 1226c.

The curved surface of the top guide part 1226a and the curved surface of the bottom guide part 1226b may be formed to face each other. A width of the hole 1226c decreases from the top surface of the inner top wall to the lower surface of the inner top wall. The curved surface of the top guide part 1226a is formed to be convex in a downwardly inclined direction of the inner top wall. The curved surface of the bottom guide part 1226b is formed to be concave in a downwardly inclined direction of the inner top wall. That is, the direction in which the curved surface of the top guide part 1226a is bent and the direction in which the curved surface of the bottom guide part 1226b is bent may be opposite to each other. The curved surface of the top guide part 1226a and the curved surface of the bottom guide part 1226b may be formed in a streamlined shape. In this case, an airflow 84 introduced into the hole 1226c may be introduced with a minimum resistance by the curved surfaces of the top and bottom guide parts 1246a and 1246b. In addition, as the resistance applied to the airflow 84 introduced into the hole 1226c is minimized, a flow separation phenomenon of the airflow 84 may be prevented, and a reduction of movement speed of the airflow 84 may be minimized, thereby preventing an occurrence of whirlpool-shaped vortex. Accordingly, it is possible to maximize an exhaust efficiency by preventing a decrease in the amount of exhaust volume.

The inner cup 1240 is located inside the outer cup 1220. The inner cup 1240 has an inner wall 1242, an outer wall 1244, and a top wall 1246. The inner wall 1242 has a through hole penetrating in an up/down direction. The inner wall 1242 is disposed to surround the driver 1460. The inner wall 1242 minimizes exposure of the driver 1460 to the airflow 84 in the treating space. The rotary shaft 1440 or/and the driver 1460 of the support unit 1400 extend in the up/down direction through the through hole. A lower end of the inner wall 1242 may be located on the bottom wall 1222 of the outer cup 1220. The outer wall 1244 is disposed to be spaced apart from the inner wall 1242 and to surround the inner wall 1242. The outer wall 1244 is disposed to be spaced apart from the sidewall 1224 of the outer cup 1220. The outer wall 1244 is disposed to be spaced apart from the protrusion 1228 of the outer cup 1220. The inner wall 1242 is disposed to be spaced apart upwardly from the bottom wall 1222 of the outer cup 1220. The top wall 1246 connects the top end of the outer wall 1244 to the top end of the inner wall 1242. The top wall 1246 has a ring shape and is disposed to surround the support plate 1420. According to an embodiment, the top wall 1246 has an upwardly convex shape. The top wall 1246 has an outer top wall 1246*a* upwardly inclined from the top end of the outer wall 1244 toward the rotary shaft 1440, and an inner top wall 1246*b* downwardly inclined from the top wall 1246 to the end of the inner wall 1242. The support plate 1420 may be located in a space surrounded by the inner top wall 1246*b*. According to an embodiment, a highest point of the top wall 1226 may be disposed outside the support plate 1420 and more inward than the end of the substrate W supported by the support unit 1400. An exhaust unit 1700 to be described later is disposed in an inner space of the inner cup 1240.

A drain tube 1250 for draining the treating liquid 82 is connected to the bottom wall 1222 of the outer cup 1220. The drain tube 1250 drains the treating liquid 82 introduced between the sidewall 1224 of the outer cup 1220 and the outer wall 1244 of the inner cup 1240, to the outside of the treating container 1200. According to an embodiment, a space between the side wall 1224 of the outer cup 1220 and the gas-liquid separation plate 1230 is provided as a drain space for draining the treating liquid 82, and the drain tube 1250 is provided to drain the treating liquid 82 from the drain space. The air flow 84 flowing into the space between the side wall 1224 of the outer cup 1220 and the outer wall 1244 of the inner cup 1240 flows into the space surrounded by the side wall 1224 and the bottom wall 1222 of the outer cup 1220 and the exhaust unit 1700, and flows into the inside of the exhaust unit 1700 and is exhausted.

One or a plurality of drain tubes 1250 may be provided. When a plurality of drain tubes 1250 are provided, the drain tubes 1250 may be arranged along the circumferential direction of the inner cup 1250.

Although not shown, a lifting/lowering driver for adjusting the height of the outer cup 1220 relative to the support plate 1420 may be provided. According to an embodiment, the lifting/lowering driver may move the outer cup 1220 in an up/down direction. For example, the support plate 1420 is located in a higher position than the top end of the outer cup 1220 to prevent interference between a transfer member for transferring the substrate W and the outer cup 1220 when the substrate W is loaded onto or unloaded from the support plate 1420. Furthermore, when a process is performed, the support plate 1420 is located in a lower height than the top end of the outer cup 1220 such that the substrate W is located within the processing space.

The exhaust unit may include an exhaust tube 1700.

The exhaust tube 1700 exhausts an airflow 84 introduced into the treating container 1200 to the outside of the treating container 1200. According to an embodiment, the exhaust tube 1700 is located in the inner space of the inner cup 1240. The exhaust tube 1700 may extend to a space between the outer wall 1244 of the inner cup 1240 and the inner wall 1242. The exhaust tube 1700 is located closer to the inner wall 1242 of the inner cup 1240 than to the outer wall 1244 of the inner cup 1240. For example, the exhaust tube 1700 is in contact with the inner wall 1242 of the inner cup 1240. The exhaust tube 1700 is spaced apart from the outer wall 1244 of the inner cup 1240. The space between the exhaust tube 1700 and the outer wall 1244 of the inner cup 1240 forms a second passage R2 through which the airflow 84 moves. A pressure adjusting member (not shown) is installed in the exhaust tube 17200 to forcibly suck the airflow 84 in the exhaust space 1248. The pressure adjusting member may be a pump. The pressure adjusting member provides a negative pressure to the inside of the treating container 1200.

A distance d1 of the first passage R1 is formed to have a width equal to or similar to a distance d2 of the second passage R2. In this case, the negative pressure formed by the pressure adjusting member is formed to be equal to or similar to a pressure in the first passage R1 and a pressure in the second passage R2. Accordingly, a negative pressure for lowering the airflow 84 introduced between the protrusion 1228 and the outer wall 1240 of the inner cup 1240, and a negative pressure introduced between the protrusion 1228 and the outer wall 1244 of the inner cup 1240 and suctioned between the outer wall 1244 of the inner cup 1240 and the exhaust tube 1700 may be formed to be equal, and may be introduced to the exhaust tube 1700 or exhausted to the outside without a vortex or a reverse flow.

Referring to the substrate treating apparatus of FIG. 1, a distance between the sidewall of the outer cup 12 and the outer wall of the inner cup 14 is formed to be greater than a distance between the outer wall of the inner wall 14 and the exhaust tube 70. According to the substrate treating apparatus of FIG. 1, a negative pressure formed in a first space A1 between the side wall of the outer cup 12 and the outer wall of the inner cup 14 is larger than a negative pressure formed in a second space A2 between the outer wall of the inner wall 14 and the exhaust tube 70. In this case, while the amount of airflow 84 flowing into the first space A1 is large, the amount of airflow passing through the second space A2 is small, and thus a stagnation of the airflow 84 occurs near the bottom wall of the outer cup 12 in which the flow direction of the airflow 84 is changed. Due to the stagnation of the airflow 84, a vortex of the airflow 84 is generated near the bottom wall of the outer cup 12, and thus the airflow 84 introduced into a space between the sidewall of the outer cup 12 and the exhaust tube 70 flows back into the first space A1.

However, in accordance with the inventive concept, the distance of the first passage R1 and the distance of the second passage R2 are formed to be the same, so that an amount of the negative pressure formed in each passage can be maintained to be the same. Accordingly, the airflow 84 introduced into the first passage R1 may be introduced into the exhaust tube 1700 through the second passage R2 without congestion, thereby preventing airflow congestion, preventing vortex generation, and preventing liquid splashing.

Figure 12:
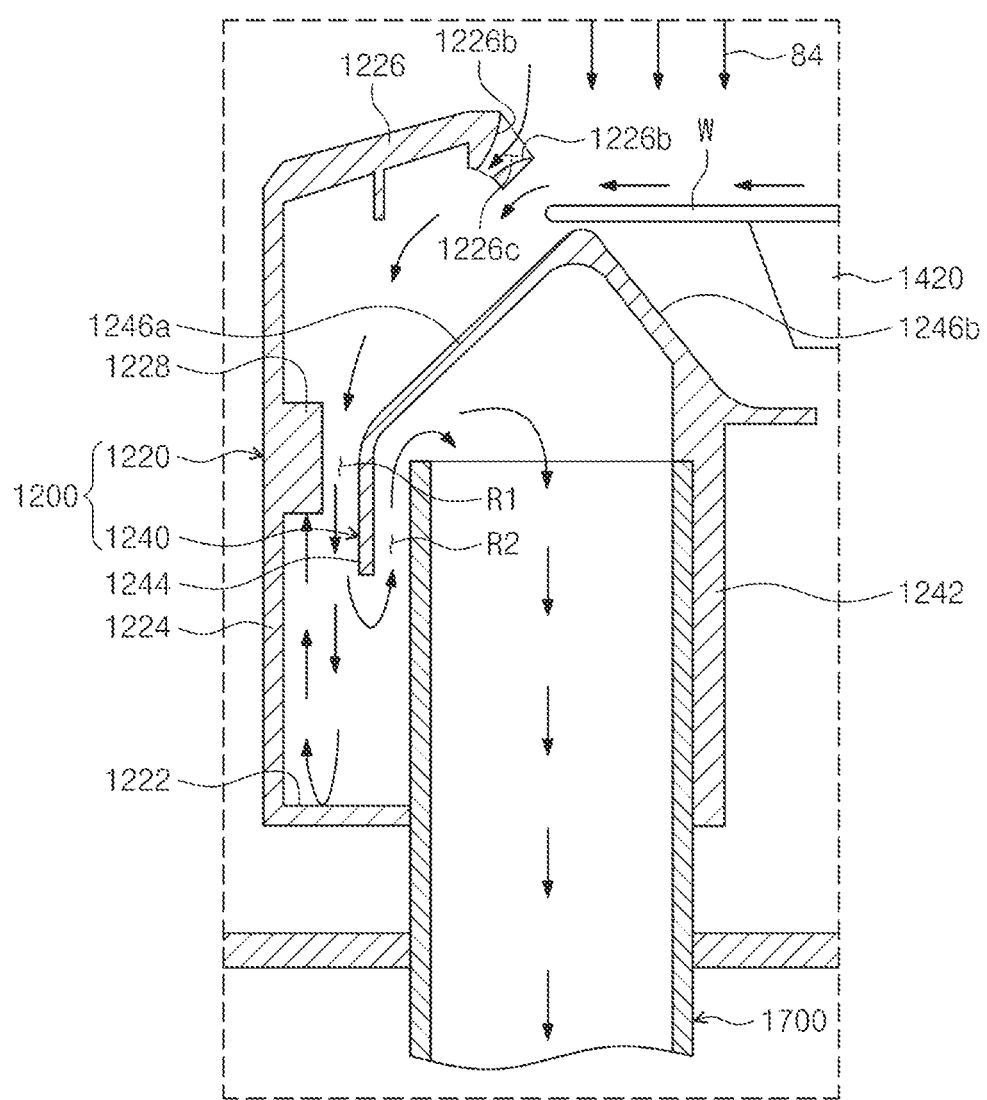
FIG. 12 is a partly sectioned sectional view illustrating a flow path of the air flow within an inner space of a treating container when the substrate is subjected to a liquid treatment through the apparatus of FIG. 9.

FIG. 12 illustrate flow paths of the air flow within the inner space of the treating container when the substrate W is subjected to liquid treatment through the apparatus of FIG. 9.

Referring to FIG. 12, in a coating process, the substrate W is supported on the support plate 1420 and is rotated by the support plate 1420. At this time, the support unit 1400 rotates the substrate W such that the air flow 84 generated by the rotation of the substrate W flows toward the inlet 3722 of the air flow guide duct 3700. Outside air is supplied as the downward air flow 84 from the fan filter unit 1260 toward the substrate W. Furthermore, the treating liquid 82 is supplied onto the substrate W from the nozzle 1620. Due to the rotation of the substrate W, the air flow 84 on the top surface of the substrate W flows toward the outside of the substrate W while curving in the rotating direction of the substrate W. When the airflow 84 flows to the outside of the substrate W, the airflow 84 and the treating liquid supplied onto the substrate W are introduced into the first passage R1 between the protrusion 1228 of the outer cup 1220 and the outer wall 1244 of the inner cup 1240. The airflow 84 introduced into the first passage R1 passes through the second passage 84 and flows into the exhaust tube 1700, and is then exhausted to the outside of the treating container 1200 through the exhaust tube 1700.

A part of the airflow 84 introduced into the first passage R1 may collide with the bottom wall 1222 of the outer cup 1220 and flow in a reverse direction. In this case, the airflow 84, which collides with the bottom wall 1222 and spatters back, collides with the protrusion 1228 and flows back into the space between the outer cup 1220 and the exhaust tube 1700. The re-introduced airflow 84 passes through the second passage R2 and flows into the exhaust tube 1700, and is then exhausted to the outside of the treating container 1200 through the exhaust tube 1700. Meanwhile, the airflow 84 spattering back does not flow into the first passage R1 due to a downward airflow of the first passage R1.

Hereinafter, the substrate treating apparatus 1000 according to another embodiment of the inventive concept will be described with reference to the drawings.

The substrate treating apparatus according to another embodiment is configured to be approximately identical to that described above, except for a configuration of the substrate treating apparatus and the protrusion unit 1228 according to the embodiment described above. Therefore, hereinafter, the same drawing number is assigned to the same configuration, redundant descriptions are omitted, and differences will be mainly described.

Figure 13:
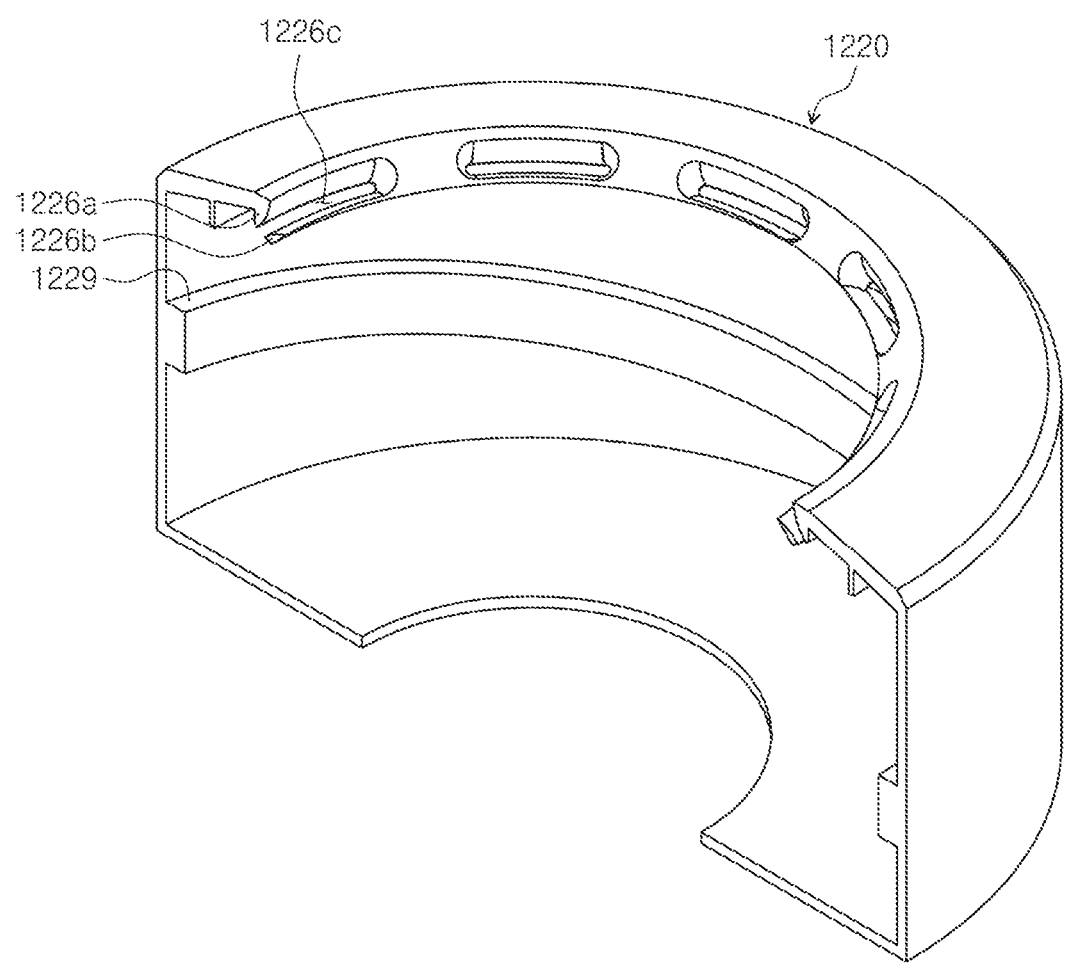
FIG. 13 is a schematic sectional view illustrating a structure of the substrate treating apparatus for treating the substrate by supplying a liquid onto the rotating substrate according to another embodiment of the inventive concept.

FIG. 13 schematically illustrates a structure of the substrate treating apparatus for treating a substrate by supplying a liquid to a rotating substrate according to another embodiment of the inventive concept.

The substrate treating apparatus 1000 according to another embodiment includes a protrusion 1229 inwardly protruding from the inner surface of the sidewall 1224 of the outer cup 1220. The protrusion 1229 is formed to extend along the inner surface of the sidewall 1224 of the outer cup 1220. In this case, the protrusion 1228 according to an embodiment extends to the sidewall 1224 of the outer cup 1220 in a state in which the distance between the bottom wall 1222 and the protrusion 1228 is equally maintained. On the other hand, the protrusion 1229 in accordance with another embodiment extends in a spiral shape along the inner surface of the sidewall 1224 of the outer cup 1220. That is, a distance between the protrusion 1229 and the bottom wall 1222 of the outer cup 1220 according to another embodiment 1229 is disposed to decrease toward the bottom wall 1222 from the top end of the outer cup 1220.

The substrate treating apparatus according to another embodiment is configured in the same manner as the substrate treating apparatus according to an embodiment except for the protrusion 1229, and the omitted description may refer to a description of the substrate treating apparatus according to an embodiment.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

What is claimed is:

1. An apparatus for treating a substrate, the apparatus comprising:
   a treating container having an inner space;
   a support unit supporting and rotating the substrate in the inner space; and
   an exhaust unit exhausting an air flow in the inner space,
   wherein the treating container comprises:
   an outer cup providing the inner space;
   an inner cup disposed at the inner space and spaced apart from the outer cup, the inner cup including an outer wall opposing the side wall of the outer cup, an inner wall opposing the outer wall, a top wall connecting the outer wall and the inner wall; and
   the outer cup including a protrusion extending along at least a portion of an inner surface of a side wall of the outer cup and protruding toward the outer wall of the inner cup and facing an outer side wall of the inner cup, the outer cup including a bottom wall, the side wall of the outer cup upwardly extending from an outer edge of the bottom wall, and a top wall inwardly extending from the side wall.

2. The apparatus of claim 1, wherein the protrusion is formed extending along a circumference of the side wall of the outer cup, and a distance between the protrusion and the bottom wall of the outer cup is uniform.

3. The apparatus of claim 1, wherein the protrusion is formed extending along a circumference of the side wall of the outer cup, and a distance between the protrusion and the bottom wall of the outer cup is gradually decreasing in a direction from a top end of the outer cup to the bottom wall.

4. The apparatus of claim 1, wherein the exhaust unit comprises:
   an exhaust tube disposed in an inside of the inner cup; and
   a pressure adjustment member forcefully exhausting an airflow within the inner space.

5. The apparatus of claim 4, wherein a first passage is formed between the protrusion and the outer wall of the inner cup, a second passage is formed between the outer wall of the inner cup and the exhaust unit, and a width of the first passage and a width of the second passage is provided equally.

6. The apparatus of claim 5, wherein a pressure sucking an air flow formed at the first passage is equal to a pressure sucking an air flow formed at the second passage and introduced into the first passage.

7. The apparatus of claim 1, wherein the top wall of the outer cup comprises:
   an outer top wall upwardly extending and inclining from the side wall of the outer cup; and
   an inner top wall downwardly extending and inclining from the top wall of the outer cup,
   the inner top wall having a hole for introducing an air flow.

8. The apparatus of claim 7, wherein the inner top wall of the outer cup comprises a top guide part disposed above the hole, and a bottom guide part disposed below the hole,
   the top guide part and the bottom guide part respectively comprising at least partially a curved surface, and the curved surface of the top guide part and the curved surface of the bottom guide part configuring an inside of the hole.

9. The apparatus of claim 8, wherein the curved surface of the top guide part curves in an opposite direction of a curving direction of the curved surface of the bottom guide part.

10. The apparatus of claim 8, wherein the curved surface of the top guide part and the curved surface of the bottom guide part are respectively provided in a streamlined shape.

* * * * *